United States Patent
Reyes

(10) Patent No.: US 6,925,622 B2
(45) Date of Patent: Aug. 2, 2005

(54) SYSTEM AND METHOD FOR CORRELATED CLOCK NETWORKS

(75) Inventor: Alberto J. Reyes, Tempe, AZ (US)

(73) Assignee: Freescale Semiconductor, Inc., Schaumburg, IL (US)

( * ) Notice: Subject to any disclaimer, the term of this patent is extended or adjusted under 35 U.S.C. 154(b) by 114 days.

(21) Appl. No.: 10/260,251

(22) Filed: Sep. 30, 2002

(65) Prior Publication Data

US 2004/0064799 A1 Apr. 1, 2004

(51) Int. Cl.[7] .............................................. G06F 17/25
(52) U.S. Cl. ...................... 716/6; 716/1; 716/2; 716/10
(58) Field of Search ............................. 716/1, 2, 6, 10, 716/18

(56) References Cited

U.S. PATENT DOCUMENTS

| | | | |
|---|---|---|---|
| 6,536,024 B1 * | 3/2003 | Hathaway | 716/6 |
| 6,625,787 B1 * | 9/2003 | Baxter et al. | 716/6 |
| 6,637,014 B2 * | 10/2003 | Casavant | 716/6 |
| 6,701,507 B1 * | 3/2004 | Srinivasan | 716/10 |

* cited by examiner

Primary Examiner—Thuan Do
(74) Attorney, Agent, or Firm—John A. Fortkort; Margaret M. Kelton; Fortkort Grether & Kelton LLP

(57) ABSTRACT

A clock network synthesis method and apparatus corrects for clock skew and impedance differences. A method includes identifying clock networks having more active elements as compared to other clock networks of a plurality of clock networks, for those identified clock networks, identifying a pattern of active elements therein as transversed by a clock signal, and for those unidentified clock networks in the correlated clock networks, adding active elements such that those added active elements transversed by the clock signal match those transversed in the identified clock networks. A method for preventing clock skew and impedance differences includes performing a clock balancing, identifying each related node across a sub-network, identifying each input driven via the identified related nodes, and adding one or more active elements to one or more nodes until each element in the identified related nodes drives a same number of inputs.

19 Claims, 6 Drawing Sheets

SYSTEM AND METHOD FOR CORRELATED CLOCK NETWORKS

BACKGROUND OF THE INVENTION

1. Field of the Invention

The present invention relates to clocking in synchronous integrated circuits in general and, more specifically, to clock network balancing to minimize clock skew.

2. Description of the Related Art

Modern integrated circuit design usually requires the use of sequential elements that transfer and store a function of the input to the sequential elements at the output of the sequential element at a given change of state of a clock. Typical sequential elements include flip-flops and latches. Such storage is necessary for controlled timing of signals within an integrated circuit.

Clock networks are constructed such that there is correct timing between sequential elements. Clock networks deliver the clock signal from the source of the clock to sequential elements through various types of logic. This logic can be comprised of clock gating, clock inverting, clock selecting, or clock delivery logic. Clock skew is defined as the difference between the arrival of the clock signal at different sequential elements. Clock skew is problematic because it can cause aberrant behavior instead of the desired synchronous behavior. For example, consider two D flip-flops with the output of a first flip-flop tied to the input of a second flip-flop. At the clock edge, the output of the first flip-flop immediately prior to the clock edge should be transferred to the output of the second flip-flop. However, if the clock to the second flip-flop is delayed significantly relative to the first flip-flop, the input to the first flip-flop can propagate through first flip-flop and appear on the input to the second flip-flop before the clock edge arrives on the second flip-flop. When this clock edge does arrive, the input of the first flip-flop will now be transferred to the output of the second flip-flop. After the clock edge, the output of the second flip-flop contains the input of the first flip-flop instead of the output of the first flip-flop due to the clock skew. Clock networks that require low skew relative to each other are correlated and referred to as correlated clock networks.

Clock skew is dominantly caused by three mechanisms. The first is the propagation delay due to the interconnect variation between different clock paths. Because the path from the clock source to the various sequential elements differs, the interconnect between these paths differ, and the time for the clock signal to propagate to these elements will differ due to the parasitic impedance per unit length. This interconnect variation is a function of the physical topology of the clock network. The second is the difference in load placed on the clock network by the input impedance of the sequential elements. Typically each clock network will be driven by an active element which is capable of sourcing a fixed amount of current. Due to the finite current drive capabilities of the active element, the impedance seen by the active element at the clocked input of the sequential elements will cause the clock to be delayed. This loading is referred to as fan out. A fan out of N indicates that the buffer is driving the equivalent of N simple gates. The third element affecting delay is the propagation delay through the active elements in the clock delivery paths. These include buffers, inverters, multiplexers, and clock delivery gates.

The loading of all sequential elements in an integrated circuit is far too large to drive with a single buffer element. Because of this, the clock is divided into several clocking networks. Typically, a given network will be driven by a separate buffer. The networks may be further divided into sub-networks until the all sub-networks have manageable loading. In modern integrated circuit design, this clock network partitioning is done with automated tools. The goal of this partitioning is to meet the timing specifications between critical sequential networks. This process is referred to as clock network synthesis.

Correlated clock networks are clock networks that require low clock skew relative to each other. This is usually because the output of the sequential devices on one clock network drive the inputs of the sequential elements on a second clock network. Additional constraints are imposed on the clock network synthesis process due to the desire for low power operation, the use of inverted clocks, and testability. Low power operation often requires that clocks be gated off when not needed, adding logic gates into the clocking network. The use of inverted clocks requires inverters be inserted into the clock network. Finally, the requirement for testability of an integrated circuit often requires that a clock network can be driven by an alternative test clock, thus requiring a multiplexer to be inserted into the clock network. All of these logic elements add delays to the clock network. These delays must be compensated for in other elements of a correlated clock network. The present state of the art consists of inserting a single buffer in other networks in an attempt to match the delays of each logic gate in the network under consideration. This is done by specifying minimum delay parameters in the clock network synthesis tool, forcing the tool to insert buffers in almost all clock networks to equalize the delays in all networks. This process is illustrated in FIGS. 1 and 2. In FIG. 1, clock network 101 is directly connected to system clock 105. Clock network 102 is a selected clock, the selection being performed by multiplexer 106 and thus incurring some delay. Clock network 103 is a gated clock, the gating being performed by logic gate 107. Clock network 104 is an inverted clock, being inverted by inverter 108. Thus, clock network 102 is delayed by one multiplexer relative to clock network 101, clock element 103 is delayed by multiplexer 106 and logic gate 107 relative to clock network 101, and clock network 104 is delayed by multiplexer 106, logic gate 107, and inverter 108 relative to clock network 101.

The present state of the art would correct for these delays as shown in FIG. 2. The object of this correction is to place the same number of active elements in all clock networks. The longest path occurs in clock network 204 and consists of three active elements. This requires that three buffers, 208, 209, and 210 be added to clock network 101 to form clock network 201, buffers 211 and 212 be added to clock network 102 to form 202, and buffer 213 be added to clock network 203. Clock network 204 is unchanged and remains the same as clock network 104.

A significant problem with the method shown in FIG. 2 is that the delays in a clocking networks are due to both the propagation delay of the logic gates as well as the interconnect delay of the clock path. The buffers do not correct for the wire loading in any way and therefore do not exactly compensate for the delays in the other networks. Further, there is no attempt to match path lengths which further increases clock skew. Finally, the buffers present different input loading and output drive as the active elements the buffers are supposed to emulate.

Typical clock synthesis tools produce a clock network that delivers the proper clock signal to all sequential elements. FIG. 3 shows two correlated clock networks before clock network synthesis. Clock network 301 has a fanout of eight while clock network 302 has a fanout of three. Note that clock network 301 has significantly more fanout than in clock network 302. In addition, the path lengths and the topology of the two networks are very different. A clock network synthesis tool might break clock network 301 into two smaller clock networks. The result after clock network synthesis of this is shown schematically in FIG. 4. This will nearly correct for differences in the clock skew due to loading, but will not have any effect on delays due to wire lengths. In addition, buffers 404 and 405 see very different fanouts.

As described above, there are a number of different dilemmas and considerations to take into account for correlated clock networks. What is needed is a clock network synthesis method that matches the active elements in correlated clock networks, matches loading of active nodes in correlated clock networks, and matches a physical topology of correlated clock networks.

SUMMARY OF THE INVENTION

Accordingly, a clock network synthesis method, apparatus and computer-readable medium are provided that balances correlated clock networks. A method for balancing correlated clock networks is provided that includes identifying one or more clock networks of a plurality of clock networks, the one or more clock networks having more active elements as compared to other clock networks of the plurality of clock networks, for those identified clock networks, identifying a pattern of active elements therein as traversed by a clock signal, and, for those unidentified clock networks in the correlated clock networks, adding active elements such that those added active elements traversed by the clock signal match those traversed in the identified clock networks. In one embodiment, the method includes setting the added active elements to a state that does not alter the functionality of the correlated clock networks. The method further includes adding active elements such that the added active elements match a clock network delay for each of the clock networks in the plurality of correlated clock networks.

Another embodiment is directed to a method for balancing correlated clock networks. The method includes identifying each clock path within the correlated clock networks that do not have a longest series of non-clock signal delivering logic cells, for each identified clock path, adding one or more logic cells to the identified clock path until each active element matches each active element in a path with the longest series of non-clock signal delivering logic cells, and setting one or more inputs to the added logic cells to a value that will pass a clock signal.

One embodiment provides a method for preventing clock skew and impedance differences affecting a correlated clock network, which can include computer-readable medium containing computer-executable instructions for performing the method. The method includes performing a clock balancing for the correlated clock network, identifying each related node across a sub-network in the correlated clock network, identifying each input driven via the identified related nodes, and adding one or more active elements to one or more nodes in the identified related nodes until each element in the identified related nodes drives a same number of inputs. The added elements can mirror any pre-existing elements in the identified related node. Further, the added elements can be placed in close proximity to the mirrored pre-existing elements for further loading benefits.

An embodiment directed to an apparatus and computer-readable medium containing computer-executable instructions. The apparatus is configured for clock balancing includes means in a correlated clock network including a plurality of clock networks, for identifying one or more clock networks of the plurality of clock networks, the one or more clock networks having more active elements as compared to other clock networks of the plurality of clock networks; for those identified clock networks, means for identifying a pattern of active elements therein as traversed by a clock signal; and, for those unidentified clock networks in the correlated clock networks, means for adding active elements such that those active elements traversed by a clock signal match those traversed in the clock networks with the most active elements.

Another embodiment is directed to a network synthesis tool for preventing clock skew and impedance differences affecting a correlated clock network. The network synthesis tool includes a clock balancing module to clock balance the correlated clock network, a node identification module to identify any related nodes across a sub-network in the correlated clock network, an input identification module to identify each input driven via the identified related nodes, and an element insertion module to add one or more active elements to one or more nodes in the identified related nodes until each element in the identified related nodes drives a same number of inputs.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Embodiments discussed herein address issues with present clock network synthesis techniques that minimize clock skew, minimize residual clock skew due to different topologies of clock networks, and address different loadings of clock networks.

Figure 1:
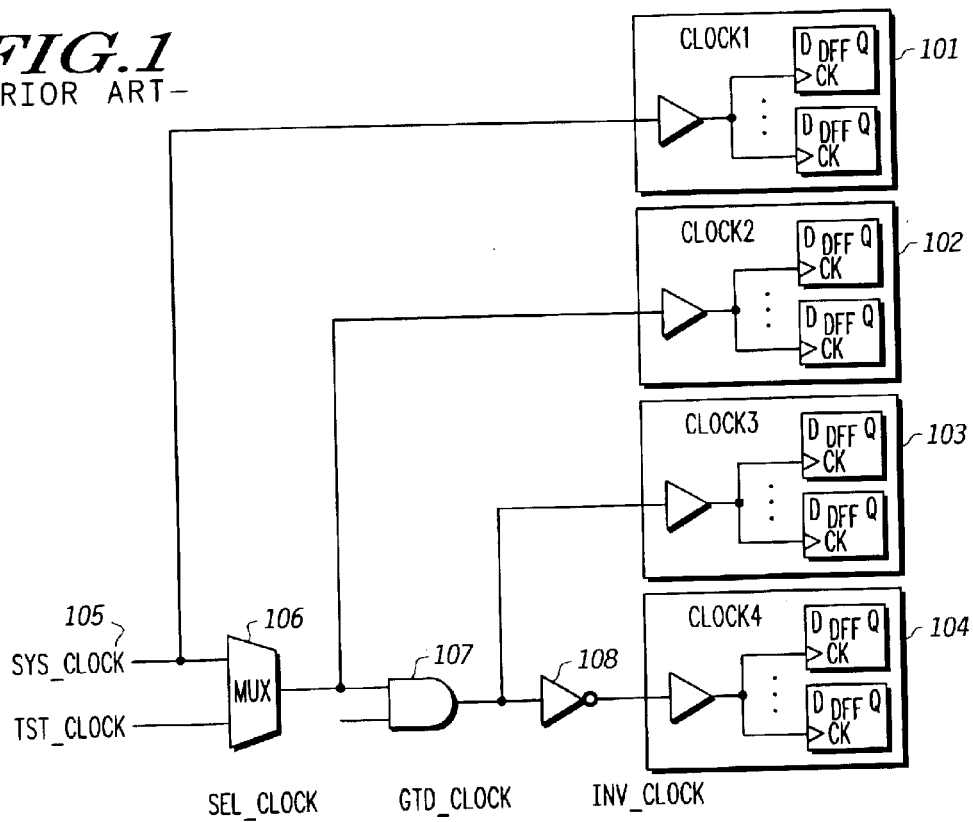
FIG. 1 labeled "prior art" illustrates is a view of a clock network with no balancing.
Figure 2:
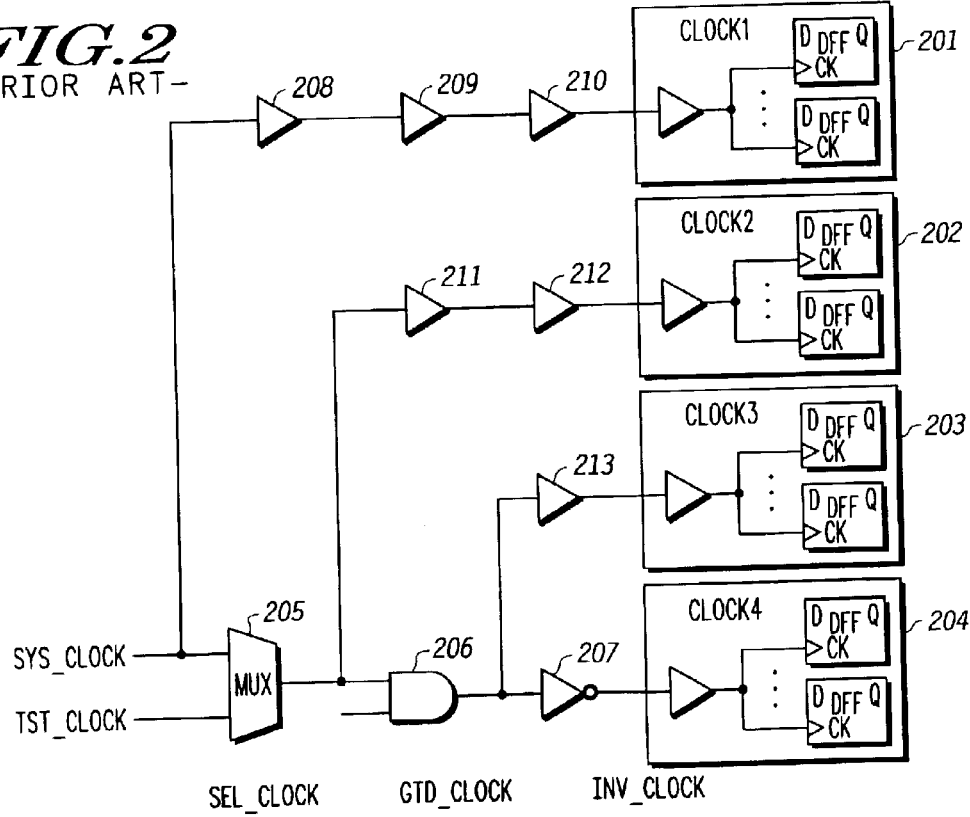
FIG. 2 labeled "prior art" illustrates a prior art balanced clock network.
Figure 3:
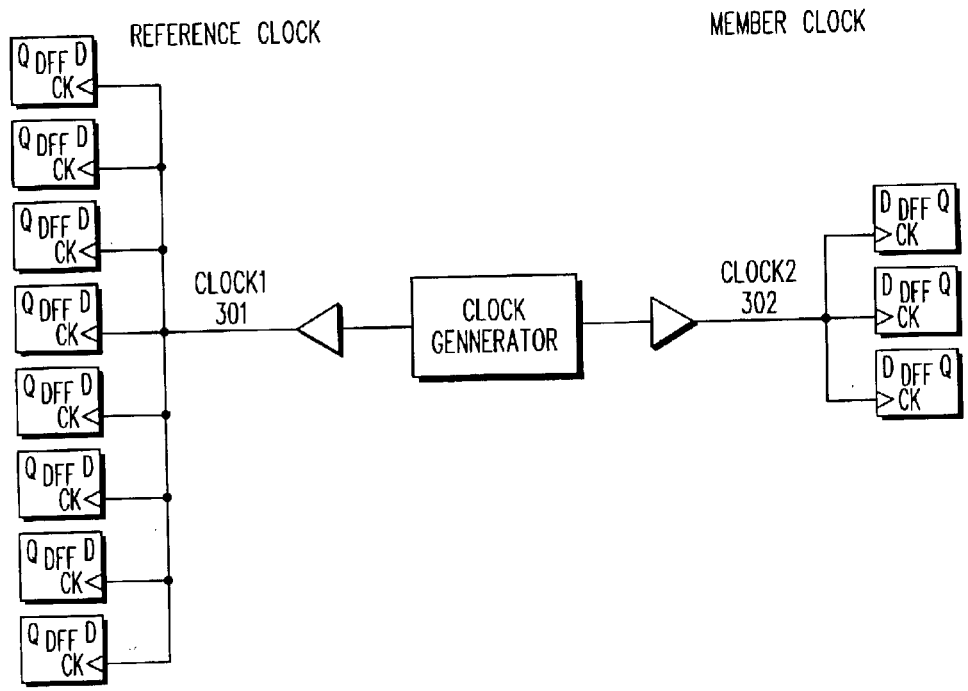
FIG. 3 labeled "prior art" illustrates a logical view of a system with two clock networks before clock network synthesis.
Figure 4:
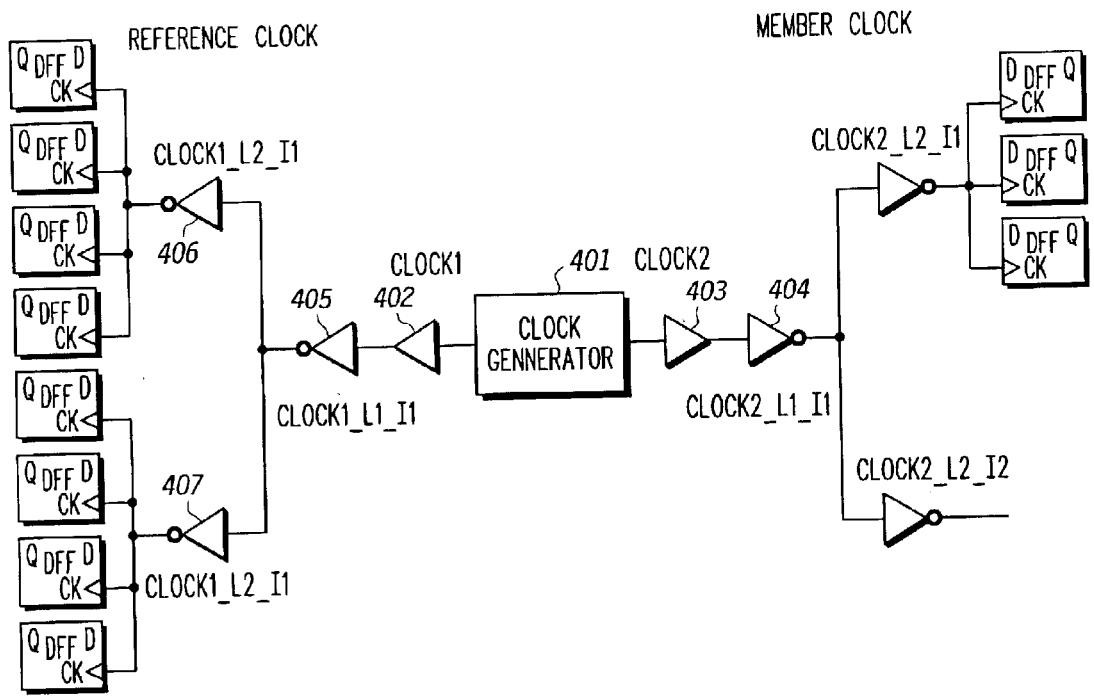
FIG. 4 labeled "prior art" illustrates a schematic view of the system in FIG. 3 after clock network synthesis.
Figure 5:
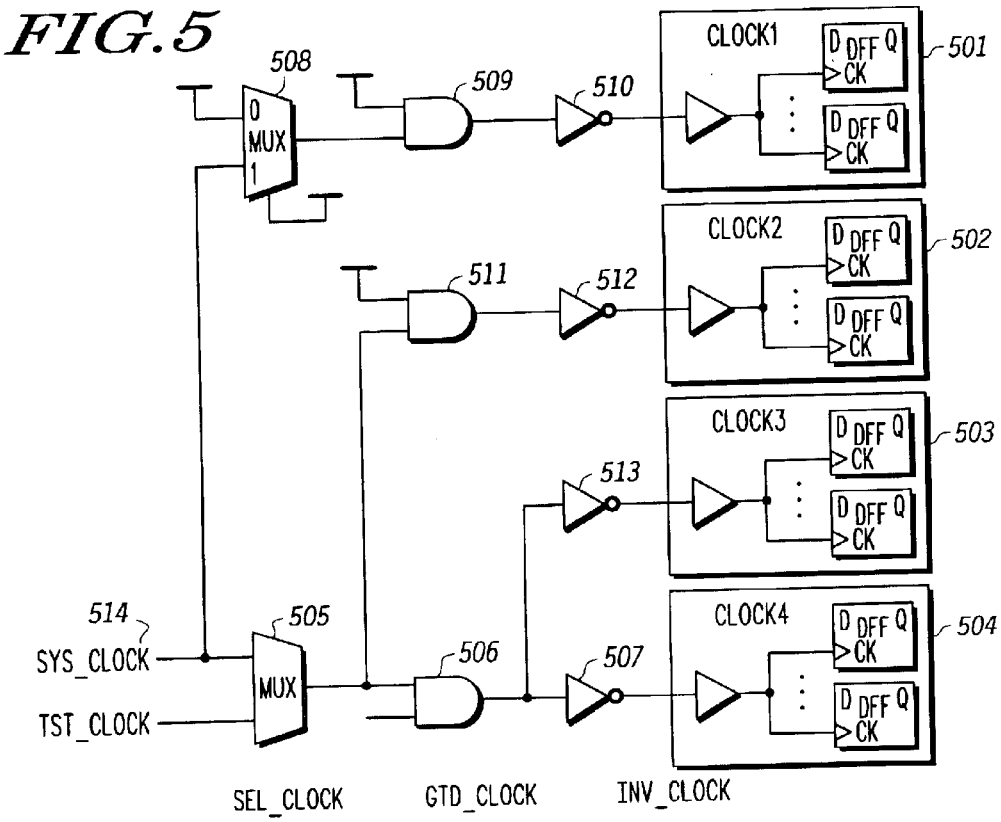
FIG. 5 is a schematic diagram illustrating matched clock balancing in accordance with an embodiment of the present invention.

One problem solved by an embodiment relates to increased clock skew due to unmatched active elements. Referring to FIG. 5, according to an embodiment, increased clock skew due to unmatched active elements is addressed by balancing all active elements in correlated clock networks. Comparing FIG. 5 with FIG. 2, which is unbalanced, FIG. 5 shows that all clock networks therein have nearly identical elements. For example, in FIG. 5 multiplexer 508 matches multiplexer 505 by replacing buffer 208 in FIG. 2. Further, to pass the system clock through as buffer 208 would in FIG. 2, multiplexer 508 is matched with multiplexer 505 such that they are in a same state for purposes of passing a system clock signal sys_clock 514. Thus, sys_clock 514 drives the same input load in both clock networks 501 and 504.

By using the same component biased to pass the sys_clock 514, the drive capabilities and propagation delay of the corresponding elements in the two clock networks 501 and 504 are nearly identical. The matching of active elements includes matching buffer 209 in FIG. 2 with logic gate 509. The node connecting multiplexer 508 and logic gate 509 matches the node connecting multiplexer 505 and logic gate 506. More specifically, both the driving elements and the input loading elements are matched in the clock networks 501 and 504. Driving elements multiplexers 508 and 505 match their respective input loading elements 509 and 506. According to an embodiment, each active element in each of the correlated clock networks, 501, 502, 503 and 504 are matched active elements. Note that clock network synthesis for the clock networks 501, 502, and 503 would necessarily need to ensure that the inverted clock signal is delivered to the sequential elements in each respective network.

Although matching active elements results in matching the associated propagation delays of the active elements, the matching of active elements fails to match the loading of the active elements in a clock network. The loading of active elements is exemplified by the node formed at the output of multiplexers 505 and 508. The outputs of multiplexers 505 and 508 differ in that multiplexer 505 drives two logic gates and multiplexer 508 drives one logic gate.

Figure 6:
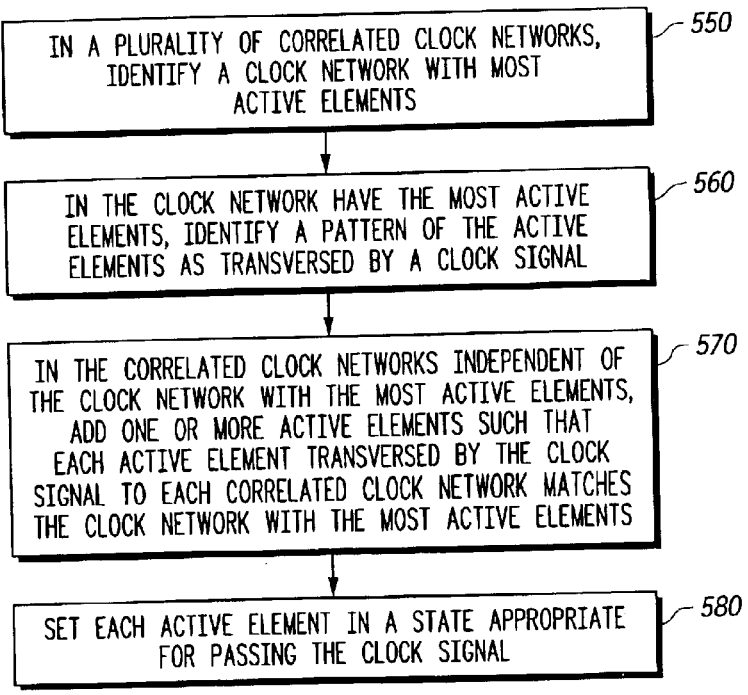
FIG. 6 illustrates a flow diagram in accordance with an embodiment of the present invention.

FIG. 6 illustrates a flow diagram in accordance with a method embodiment that addresses clock skew. More specifically, block 550 provides for identifying, in a plurality of correlated clock networks, a clock network having the most active elements. Block 560 provides for identifying, in the clock network having the most active elements, a pattern of the active elements as traversed by a clock signal. Block 570 provides for, in the correlated clock networks independent of the clock network with the most active elements, adding one or more active elements such that each active element traversed by the clock signal to each correlated clock network matches the clock network having the most active elements. Block 580 provides for setting each active element of the plurality of correlated clock networks into a state appropriate for passing the clock signal. The method provides for matching correlated clock networks by adding active elements so that a clock network having the most active elements is matched by the other clock networks. This method advantageously minimizes clock skew.

Figure 7:
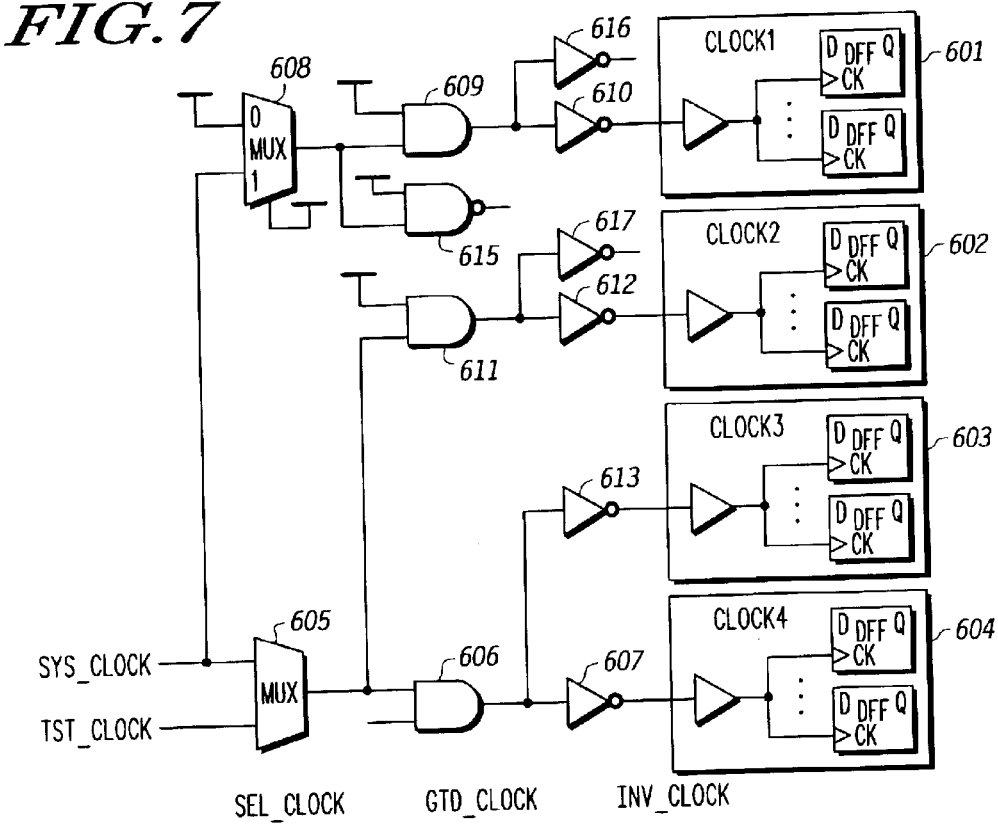
FIG. 7 is a schematic diagram illustrating stub nodes for impedance balancing in correlated clock networks in accordance with an embodiment of the present invention.

FIG. 7 illustrates an embodiment directed to matching the loading of the active elements. According to the embodiment, a second logic gate is added that attaches to the output of multiplexer 508. As shown, multiplexer 608 drives logic gate 609 and the additional logic gate 615. In a similar manner, inverters 616 and 617 are added to the outputs of logic gates 609 to 611 to match the load driven by logic gate 606. The schematic in FIG. 7 now has clock networks for which each of the active elements traversed by each of the correlated clock networks are matched and the loads on the output of each of the active elements are also matched.

Figure 8:
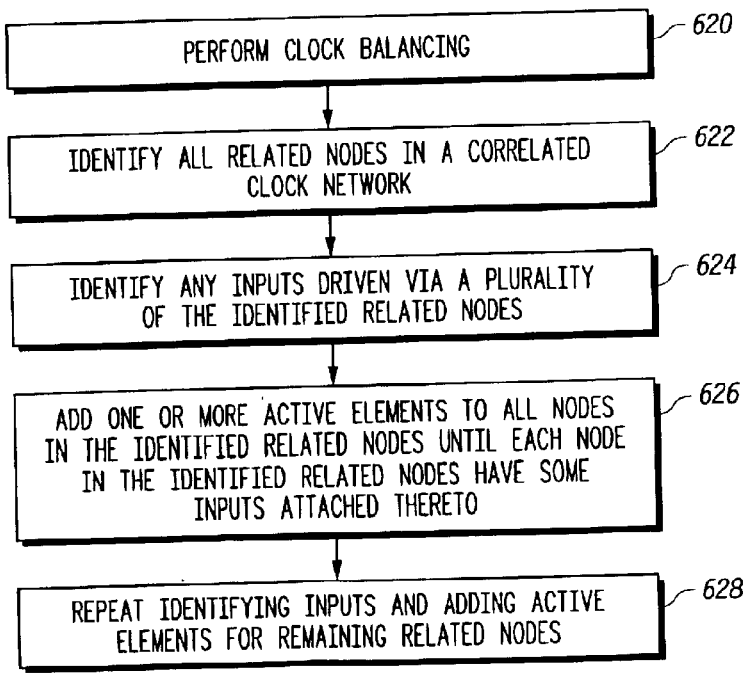
FIG. 8 illustrates a flow diagram in accordance with an embodiment of the present invention.

Referring to FIG. 8, a flow diagram illustrates the method associated with FIG. 7. Block 620 provides for performing clock balancing as described above with reference to FIGS. 5 and 6. Block 622 provides for identifying all related nodes in a correlated clock network. Related nodes, for purposes of this disclosure refers to nodes that are driven by equivalent logical elements, whether inserted or otherwise. Related nodes and the like devices driven by the related nodes are referred to as sub-networks. For example, after matching, the node connecting multiplexer 508 and logic gate 509 is related to the node connecting multiplexer 505 and logic gate 506. Block 624 provides for identifying any inputs driven via a plurality of the identified related nodes. Block 626 provides for adding one or more active elements to all nodes in the identified related nodes until each element in the identified related nodes drives a same number of inputs. Block 628 provides for repeating the process of the identifying any inputs and the adding of one or more active elements for other remaining related nodes.

Figure 9:
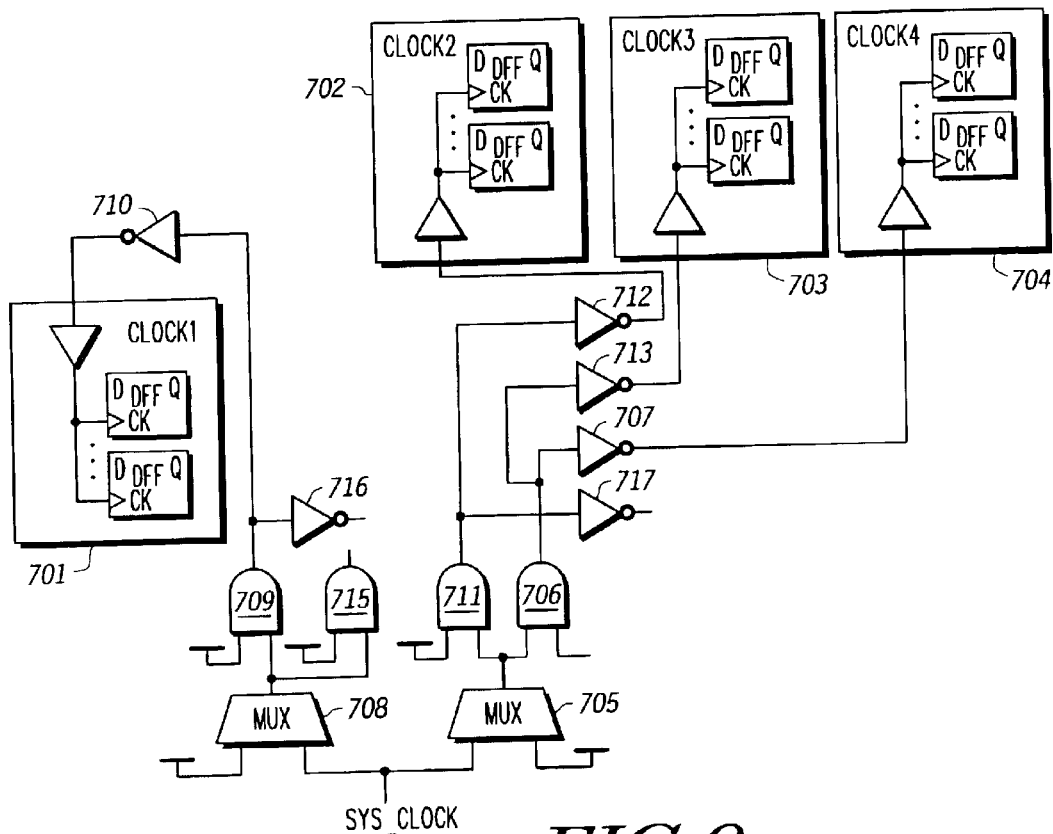
FIG. 9 shows a physical layout showing matched physical topologies for impedance balancing in correlated clock networks in accordance with an embodiment of the present invention.

The clock networks 601, 602, 603 and 604 have matched schematics. However, if the clock networks have significantly different physical layouts, the parasitic effects and propagation delays cause significant clock skew. FIG. 9 shows one possible layout of clock networks 701, 702, 703 and 704. The physical layout of the clock networks 701, 702, 703 and 704 is matched as much as possible. More specifically, to equalize impedances on equivalent nodes in correlated clock networks, active elements can be added that do not functionally change the clock networks, but only alter impedances on selected nodes. These elements and networks are referred to herein as "stub" elements and networks that are inert functionally except for affecting impedances.

The matching of the physical layout includes inserting stub networks and stub elements such as inverter 717 and associated traces, logic gate 715, inverter 716 and any related traces. Note that the elements 717, 715 and 716 may also be added for purposes of matching if necessary as described above with reference to FIGS. 7 and 8. According to an embodiment, these stub networks are designed to mirror the associated elements in correlated clock networks both schematically and in physical topology. The elements are placed in close proximity to the elements they mirror to reduce impedance alteration effects. For example, logic gate 715 mirrors existing logic gate 711 and logic gate 715 is placed near logic gate 711. In addition to being physically near the mirrored elements, the placement also is such that the physical layout of all the clock networks is kept as similar as possible. Inverter 716 mirrors inverter 713 and inverter 717. It is not possible for this inverter to be placed near inverters 713 and 717 without significantly distorting the physical layout of clock network 701 as compared to clock networks 702, 703, and 704. In this case, the physical topology of the network was preserved with the chosen placement of 716. One of ordinary skill in the art with the benefit of the present disclosure will recognize that clock network synthesis tools could evaluate the options of placing inverter 716 and preserve the physical topology of the clock networks. Optionally, in one embodiment, preserving a physical topology can be accomplished by estimating the clock skew with a plurality of placements and choosing the one that minimizes any clock skew. For example, inverter 716 could be placed physically near the elements it mirrors by an estimation procedure.

Figure 10:
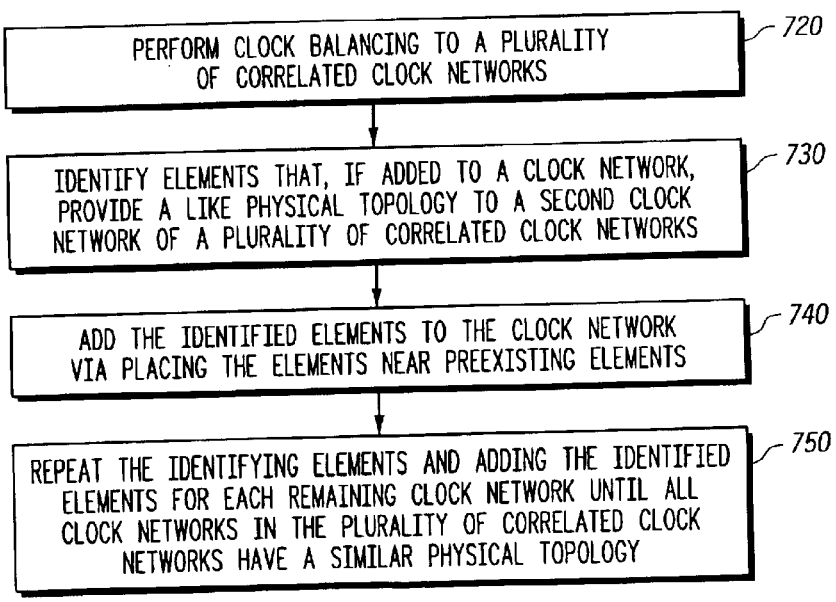
FIG. 10 illustrates a flow diagram in accordance with an embodiment of the present invention.

Referring now to FIG. 10 a flow diagram illustrates a method according to an embodiment. More particularly, block 720 provides for performing clock balancing to a plurality of correlated clock networks, such as the matching provided above with reference to FIGS. 5 and 7. Block 730 provides for identifying elements that, if added to one of the clock networks in the plurality of correlated clock networks, provide a like physical topology to a second clock network of the plurality of correlated clock networks. Block 740 provides for the added the identified elements to the clock network being placed near pre-existing elements. Block 750 provides for repeating the identifying of elements and adding the identified elements for each remaining clock network until all clock networks in the plurality of correlated clock networks have a similar physical topology. After performing blocks 720 through 750, the correlated clock networks have reduced parasitic effects and propagation delays as compared to the correlated clock networks existing prior to performing the method.

Figure 11:
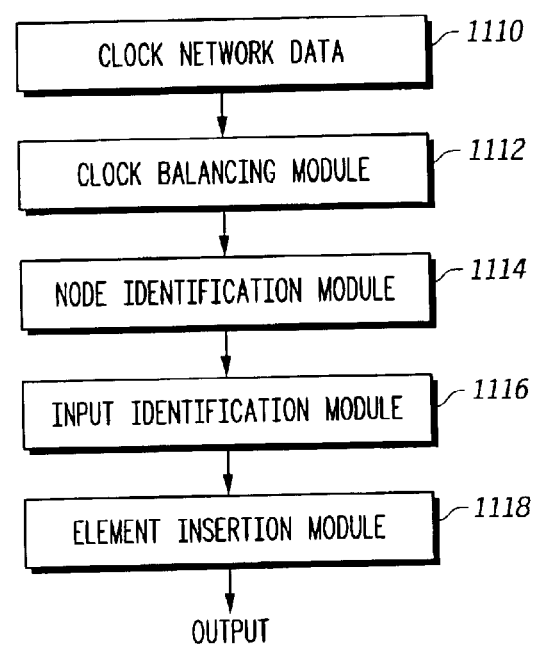
FIG. 11 illustrates a software implementation in accordance with an embodiment of the present invention.

Referring now to FIG. 11, an embodiment is directed to a network synthesis tool implementation. More particularly, a network synthesis tool is shown that is capable of preventing clock skew and impedance differences affecting a correlated clock network. The network synthesis tool can be implemented as software or one or more combinations of software, firmware and hardware. As shown, clock network data 1110 is received at clock balancing module 1112, wherein clock balancing module 1112 performs clock balances of a correlated clock network. Node identification module 1114 is shown coupled to clock balancing module 1112 and receives the signal representing a balanced correlated clock network. Node identification module 1114 identifies any related nodes across a sub-network in the correlated clock network. Input identification module 1116 is coupled to node identification module 1114. Input identification module 1116 identifies each input driven via the identified related nodes. The output of input identification module 1118 is provided to element insertion module 1118, which determines whether or not to add one or more active elements to one or more nodes in each of the identified related nodes until each node of element in the identified related nodes drives a same number of inputs. The output of element insertion module 1118 can be provided to further network tools to complete network synthesis or to a network programmer or other appropriate network tools.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Further, regarding the signals described herein, those skilled in the art will recognize that a signal may be directly transmitted from a first block to a second block, or a signal may be modified (e.g., amplified, attenuated, delayed, latched, buffered, inverted, filtered or otherwise modified) between the blocks. The logic gates shown are merely exemplary and are not intended to limit the scope of the invention in any way.

What is claimed is:

1. A method for balancing correlated clock networks, the method comprising:

in a correlated clock network including a plurality of clock networks, identifying one or more clock networks of the plurality of clock networks, the one or more clock networks having more active elements as compared to other clock networks of the plurality of clock networks;

for those identified clock networks, identifying a pattern of active elements therein as traversed by a clock signal; and for those unidentified clock networks in the correlated clock networks, adding active elements such that those added active elements traversed by the clock signal match those traversed in the identified clock networks.

2. The method of claim 1 further comprising setting the added active elements to a state that does not alter the functionality of the correlated clock networks.

3. The method of claim 1 wherein matching of active elements lowers skew between the clock networks in the plurality of correlated clock networks.

4. The method of claim 1 wherein the adding of active elements matches a clock network delay for each of the clock networks in the plurality of correlated clock networks.

5. A method for balancing correlated clock networks, the method comprising:

identifying each clock path within the correlated clock networks that do not have a longest series of non-clock signal delivering logic cells;

for each identified clock path, adding one or more logic cells to the identified clock path until each active element matches each active element in a path with the longest series of non-clock delivering logic cells; and setting one or more inputs to the added logic cells to a value that will pass a clock signal.

6. The method of claim 5 wherein each clock path matches in propagation delay.

7. A method for preventing clock skew and impedance differences affecting a correlated clock network, the method comprising:

performing a clock balancing for the correlated clock network;

identifying each related node across a sub-network in the correlated clock network;

identifying each input driven via the identified related nodes; and adding one or more active elements to one or more nodes in the identified related nodes until each element in the identified related nodes drives a same number of inputs.

8. The method of claim 7 wherein the added elements mirror any pre-existing elements in the identified related node.

9. The method of claim 8 wherein the added one or more elements are placed in close proximity to the mirrored pre-existing elements.

10. An apparatus configured for clock balancing, the apparatus comprising:

means in a correlated clock network including a plurality of clock networks, for identifying one or more clock networks of the plurality of clock networks, the one or more clock networks having more active elements as compared to other clock networks of the plurality of clock networks;

for those identified clock networks, means for identifying a pattern of active elements therein as traversed by a clock signal; and for those unidentified clock networks in the correlated clock networks, means for adding active elements such that those active elements traversed by a clock signal match those traversed in the clock networks with the most active elements.

11. A computer-readable medium containing computer-executable instructions to perform a method for clock balancing, the method comprising:

identifying each clock path within the correlated clock networks that do not have a longest series of non-clock signal delivering logic cells;

for each identified clock path, adding one or more logic cells to the identified clock path until each active element matches each active element in a path with the longest series of non-clock delivering logic cells; and setting one or more inputs to the added logic cells to a value that will pass a clock signal.

12. The computer-readable medium of claim 11 further comprising computer-executable instructions to perform for each logic cell in the series, setting one or more inputs to non-controlling values.

13. A computer-readable medium containing computer-executable instructions to perform a method for balancing correlated clock networks, the method comprising:

in a correlated clock network including a plurality of clock networks, identifying one or more clock networks of the plurality of clock networks, the one or more clock networks having more active elements as compared to other clock networks of the plurality of clock networks;

for those identified clock networks, identifying a pattern of active elements therein as traversed by a clock signal; and for those unidentified clock networks in the correlated clock networks, adding active elements such that those added active elements traversed by the clock signal match those traversed in the identified clock networks.

14. The computer-readable medium of claim 13 having further computer-executable instructions for setting active elements added to the plurality of correlated clock networks to a state that allows appropriate clock signals to pass through similarly to those active elements to which the added active elements were added.

15. The computer-readable medium of claim 13 wherein the adding active elements lowers skew between the clock networks in the plurality of correlated clock networks.

16. The computer-readable medium of claim 13 wherein the adding of active elements matches a clock network delay for each of the clock networks in the plurality of correlated clock networks.

17. A computer-readable medium containing computer-executable instructions to perform a method for preventing clock skew and impedance differences affecting a correlated clock network, the method comprising:

performing a clock balancing for the correlated clock network;

identifying any related nodes in the correlated clock network;

identifying any inputs driven via one or more of the identified related nodes; and adding one or more active elements to each of the identified related nodes until each node of the identified related nodes have same inputs attached thereto.

18. The computer-readable medium of claim 17 wherein the performing a clock balancing includes:

in the correlated clock network including a plurality of clock networks, identifying one or more clock networks of the plurality of clock networks, the one or more clock networks having more active elements as compared to other clock networks of the plurality of clock networks;

for those identified clock networks, identifying a pattern of active elements therein as traversed by a clock signal; and for those unidentified clock networks in the correlated clock networks, adding active elements such that those added active elements traversed by the clock signal match those traversed in the identified clock networks.

19. A network synthesis tool for preventing clock skew and impedance differences affecting a correlated clock network, the network synthesis tool comprising:

a clock balancing module to clock balance the correlated clock network;

a node identification module to identify any related nodes across a sub-network in the correlated clock network;

an input identification module to identify each input driven via the identified related nodes; and an element insertion module to add one or more active elements to one or more nodes in the identified related nodes until each element in the identified related nodes drives a same number of inputs.

* * * * *